(12) United States Patent
Byun et al.

(10) Patent No.: US 11,753,725 B2
(45) Date of Patent: Sep. 12, 2023

(54) NON-METAL MEMBER WITH COLORED SURFACE AND METHOD OF COLORING NON-METAL SURFACE

(71) Applicant: KOREA INSTITUTE OF SCIENCE AND TECHNOLOGY, Seoul (KR)

(72) Inventors: Ji Young Byun, Seoul (KR); Kwang-deok Choi, Seoul (KR); In Uk Baek, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 364 days.

(21) Appl. No.: 17/017,892

(22) Filed: Sep. 11, 2020

(65) Prior Publication Data

US 2021/0115550 A1    Apr. 22, 2021

(30) Foreign Application Priority Data

Oct. 22, 2019  (KR) .......................... 10-2019-0131648

(51) Int. Cl.
| | | |
|---|---|---|
| *B32B 15/04* | (2006.01) | |
| *C23C 28/00* | (2006.01) | |
| *H01L 21/02* | (2006.01) | |
| *B32B 15/08* | (2006.01) | |
| *B32B 15/10* | (2006.01) | |
| *B82Y 40/00* | (2011.01) | |
| *B82Y 30/00* | (2011.01) | |

(52) U.S. Cl.
CPC ............ *C23C 28/345* (2013.01); *C23C 28/32* (2013.01); *H01L 21/0228* (2013.01); *B82Y 30/00* (2013.01); *B82Y 40/00* (2013.01)

(58) Field of Classification Search
None
See application file for complete search history.

(56) References Cited

U.S. PATENT DOCUMENTS

| | | | | |
|---|---|---|---|---|
| 4,210,695 A | * | 7/1980 | Hirono ................. | C25D 11/022 428/209 |
| 2003/0087071 A1 | * | 5/2003 | Hsu ...................... | C25D 11/246 428/209 |

FOREIGN PATENT DOCUMENTS

| | | | | |
|---|---|---|---|---|
| CA | 2870523 A1 | * | 5/2016 | ............... B44C 1/22 |
| KR | 101499487 B1 | | 3/2015 | |

* cited by examiner

*Primary Examiner* — Michael J Feely
(74) *Attorney, Agent, or Firm* — Rabin & Berdo, P.C.

(57) ABSTRACT

According to one aspect of the present invention, a non-metal member having a colored surface is provided. The non-metal member having a colored surface includes a non-metal substrate; a metal coating layer disposed on the non-metal substrate; a light-transmissive dielectric layer disposed on the metal coating layer; and a color pattern structure disposed on the light-transmissive dielectric layer.

12 Claims, 5 Drawing Sheets

NON-METAL MEMBER WITH COLORED SURFACE AND METHOD OF COLORING NON-METAL SURFACE

CROSS-REFERENCE TO RELATED APPLICATION(S)

This application claims the benefit of Korean Patent Application No. 10-2019-0131648, filed on Oct. 22, 2019, in the Korean Intellectual Property Office, the entire disclosure of which is incorporated herein by reference.

BACKGROUND

1. Field

The following description relates to a non-metal member having a colored surface and a method of coloring a non-metal surface, and more specifically, to a non-metal member that exhibits various metallic lustrous colors by applying a color pattern structure on the surface of the non-metal member and a method of coloring a non-metal surface to impart such metallic lustrous colors.

2. Description of Related Art

Recently, consumption patterns of consumers are changing from function-oriented consumption to customer-oriented consumption, seeking satisfaction in both design and function. In line with this trend, research is being conducted in the field of material technology to develop materials that can stimulate consumers' sensibility to purchase. Sensibility refers to the ability to feel or perceive a stimulus or a change in a stimulus. When the five human senses react to a stimulus, the sensibility of sight is the most excellent, where 87% of the stimulus is perceived by the sense of sight, 7% by the sense of hearing, 3% by sense of touch, 2% by the sense of smell, and 1% by the sense of taste. For this reason, the majority of sensory marketing strategies has focused on, particularly, the sense of sight. Color affects consumers' psychology, acts as a decisive clue to purchase decisions, and serves as a factor in building a brand image.

However, it is very difficult to control a desired color according to the type of material, and colors are controlled differently on non-metallic materials such as glass, plastic, and wood according to light absorption, reflection, and transmission.

Recently, a method of exhibiting color by applying a coating composition to a surface of a non-metal material has been proposed to impart excellent adhesion and various colors to the surface of the non-metal material. It is known that an organic functional silane compound, a silane coupling agent, colloidal silica, an organic solvent, and a curing agent are used in the conventional coating composition, but there is a problem in workability due to a separate aging process. In addition, when a strong coating film is formed and coated on a non-metal material, such as plastic, delamination of coating may occur due to heat shrinkage and expansion difference.

In addition, a glass coating composition using curing between isocyanate and polyhydric alcohol is disclosed, but there is a problem in that a glass surface must be subjected to pretreatment. Melting and fusing a glass frit (low melting point glass powder) at a high temperature is a method widely used as a glass coating method, but this method has limitation in its use due to toxic compounds, such as lead that is harmful to the human body.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

In one general aspect, there is provided a non-metal member having a colored surface including a non-metal substrate; a metal coating layer disposed on the non-metal substrate; a light-transmissive dielectric layer disposed on the metal coating layer; and a color pattern structure disposed on the light-transmissive dielectric layer.

The color pattern structure may include a plurality of metal nanoparticles spaced apart from each other, a composite material layer, or a metal pattern.

The composite material layer may include a metal and a first material that is not thermodynamically soluble in the metal, the metal in the composite material layer may be applied to only a part of an upper surface of the light-transmissive dielectric layer to form a pattern, and the first material may be applied to a remaining part where the metal is not applied.

The metal may include any one of Ag, Al, Au, Co, Cu, Ni, Pd, Pt, and Re.

The first material may include any one of carbon, Si, Ge, and Si—Ge alloys.

The metal coating layer may include any one of Fe, Al, Cu, Ni, Mg, Zn, Ti, Cr, Ag, Au, Pt, Pd pure metal, and alloys thereof.

The light-transmissive dielectric layer may include any one of $TiO_2$, $Al_2O_3$, MgO, $SiO_2$, $Si_3N_4$, and indium tin oxide (ITO).

A thickness of the light-transmissive dielectric layer may be in a range of 5 nm to 200 nm.

A thickness of the metal coating layer may be 50 nm or more.

An average particle size of the metal nanoparticles may be in a range of 2 nm to 50 nm.

The non-metal member may further include a bonding layer interposed between the non-metal substrate and the metal coating layer to improve adhesion.

A thickness of the bonding layer may be 100 nm or less (greater than 0).

The bonding layer may include any one of Ti, Mo, W, Al, Cr, and Ni—Cr.

In another general aspect, there is provided a method of coloring a non-metal surface including forming a metal coating layer on one surface of a non-metal substrate; forming a light-transmissive dielectric layer on the metal coating layer; and forming a color pattern structure on the light-transmissive dielectric layer.

The forming of the color pattern structure may include forming a metal pattern with a plurality of metal nanoparticles disposed to be spaced apart from each other by using one selected from physical vapor deposition (PVD), chemical vapor deposition (CVD), and atomic layer deposition (ALD).

The forming of the color pattern structure may include forming, on the light-transmissive dielectric layer, a composite material layer made of a metal and a first material that is not thermodynamically soluble in the metal, wherein the metal in the composite material layer is applied to only a part of an upper surface of the light-transmissive dielectric layer to form a pattern and the first material is applied to a remaining part where the metal is not applied.

A metal pattern may be formed by selectively removing the first material from the composite material layer and retaining the metal.

The forming of the composite material layer may include simultaneously depositing the metal and the first material on one surface of the light-transmissive dielectric layer.

The simultaneously depositing may include separately preparing deposition sources of the metal and the first material and then depositing the metal and the first material from the respective deposition sources over an upper surface of the light-transmissive dielectric layer.

The simultaneously depositing may include using a mixture or alloy of the metal and the first material as a single deposition source.

When the first material includes carbon, the metal may include any one of Ag, Al, Au, Co, Cu, Ni, Pd, Pt, Re, and Zn.

When the first material includes any one of Si, Ge, and Si—Ge alloys, the metal may include any one of Ag, Au, Al, and Zn.

The pattern of the applied metal may have a shape in which a plurality of metal nanoparticles spaced apart from each other are dispersed.

The pattern of the applied metal may have a shape of a channel having a plurality of widths which is connected and extended.

The selectively removing of the first material may include removing the first material using chemical etching.

The selectively removing of the first material may include removing the first material using a combustion process.

The method may further include, prior to forming the light-transmissive dielectric layer, forming a bonding layer on the non-metal substrate.

The forming of the bonding layer may include forming the bonding layer on the non-metal substrate using one selected from PVD, CVD, and ALD.

Other features and aspects will be apparent from the following detailed description, the drawings, and the claims.

Figure 1:
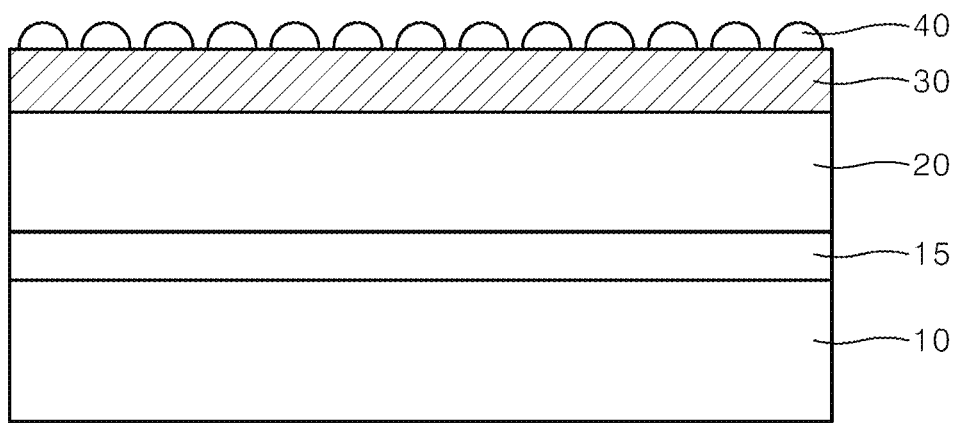
FIG. 1 is a diagram schematically illustrating a structure of a non-metal member having a colored surface according to one embodiment of the present invention.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. Also, descriptions of well-known functions and constructions may be omitted for increased clarity and conciseness.

According to one embodiment of the present invention, there is provided a non-metal member having a colored surface to which a color pattern structure (metal nanoparticles, composite material layer, or metal pattern) is applied.

FIG. 1 is a diagram schematically showing a cross-sectional structure of a non-metal member 100 having a colored surface according to one embodiment of the present invention.

Referring to FIG. 1, the non-metal member 100 includes a non-metal substrate 10, a metal coating layer 20 disposed on the non-metal substrate 10, a light-transmissive dielectric layer 30 disposed on the metal coating layer 20, and a plurality of nanoparticles 40 spaced apart from each other and disposed as a color pattern structure on the light-transmissive dielectric layer 30.

The non-metal substrate 10 may include a non-metal material, for example, polymer, ceramic, or wood.

The metal coating layer 20 is a coating layer made of a metal material having a predetermined thickness on one surface of the metal substrate 10, wherein the metal include any one of, for example, Fe, Al, Cu, Ni, Mg, Zn, Ti, Cr, Ag, Au, Pt, Pd pure metal, and alloys thereof (e.g., stainless steel, brass, bronze, cupronickel, duralumin, etc.).

The non-metal substrate 10 and the metal coating layer 20 are made of different materials from each other, and thus, may exhibit low adhesion in some cases. Accordingly, in order to improve the bonding force between the non-metal substrate 10 and the metal coating layer 20, a bonding layer 15 may be interposed between the non-metal substrate 10 and the metal coating layer 20.

The bonding layer 15 has a thickness in the range of 100 nm or less (greater than 0), and may include, for example, any one of Ti, Mo, W, Al, Cr, and Ni—Cr. The bonding layer 15 may be formed using any one selected from physical vapor deposition (PVD), chemical vapor deposition (CVD), and atomic layer deposition (ALD).

The thickness of the metal coating layer 20 is an important factor in imparting a metallic lustrous color to the surface of the non-metal member 100. The thickness of the metal coating layer 20 should be at least a minimum thickness that achieves the same optical properties as those when the same metal is in a bulk state. The thickness may be slightly different for each metal, but should be at least 50 nm.

The light-transmissive dielectric layer 30 is disposed on at least one surface of the metal coating layer 20. The light-transmissive dielectric layer 30 may include any one of $TiO_2$, $Al_2O_3$, MgO, $SiO_2$, indium tin oxide (ITO), and $Si_3N_4$, and may have a thickness in the range of 5 nm to 200 nm. The light-transmissive dielectric layer 30 may be formed using a thin film manufacturing process, for example, reactive sputtering, chemical vapor deposition, sol-gel, or the like.

When the plurality of metal nanoparticles 40 spaced apart from each other are disposed on one surface of the light-transmissive dielectric layer 30, it is possible to control the wavelength band absorbed among the light wavelengths incident on the metal coating layer 20 by adjusting the type, thickness, or size of the metal nanoparticles 40, and it is possible to realize various colors through appropriate control of the wavelength band absorbed.

The metal nanoparticles 40 may include any one of Au, Ag, Al, Pt, Cu, Pd, Zn, Ti, Cr, Ni, Ru pure metals, and alloys thereof, and have an average particle size in the range of 2 nm to 50 nm. The metal nanoparticles 40 exhibit a high-efficiency light absorption characteristic at a specific wavelength by coupling with the light-transmissive dielectric layer 30.

The metal nanoparticles 40 may be formed using a thin film manufacturing process. For example, the thin film manufacturing process includes a PVD method. The PVD method may include any one of, for example, evaporation, sputtering, and arc plasma deposition. In another example, a method, such as CVD or ALD, which forms a thin film using a gas reaction, may also be used.

The metal nanoparticles 40 disposed on one surface of the light-transmissive dielectric layer 30 may be formed at an initial stage of the thin film formation process, and the size and thickness of the metal nanoparticles 40 may be controlled by controlling the time taken to form the metal nanoparticles 40.

Figure 2A:
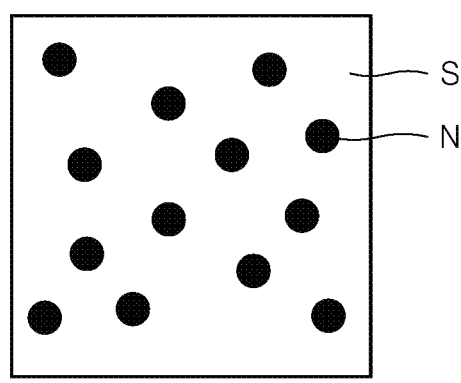
FIGS. 2A to 2C are diagrams schematically illustrating a process of forming metal nanoparticles.
Figure 2B:
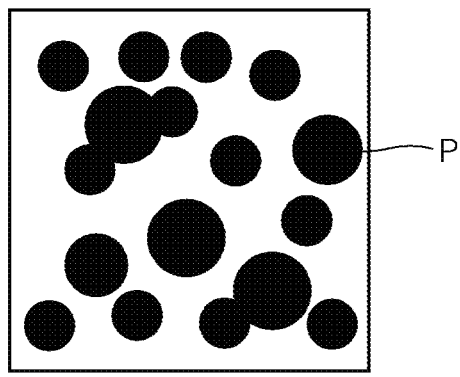
Figure 2C:
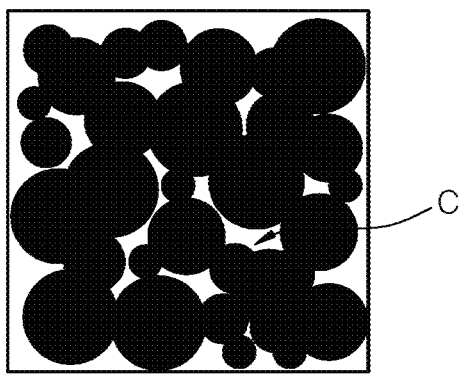

FIGS. 2A to 2C conceptually illustrate a process of forming a metal thin film on one surface of the light-transmissive dielectric layer 30.

Referring to FIG. 2A, in the initial stage of metal thin film formation, a metal cluster N is formed by agglomeration of metal atoms on one surface of a substrate S, and the metal cluster N serves as a nucleus. In this case, the size of the metal cluster N is very small, and thus the metal cluster N is applied to only a part of the substrate S and a separation distance between the metal clusters N is sufficiently secured.

As the time taken to form a thin film increases, the size and thickness of the metal cluster increases as shown in FIG. 2B, and a metal particle P is formed by merging the metal clusters. If the thin film formation continues, as the sizes of the metal particles increase and the particles are merged with each other, the metal particles are applied to almost the entire surface of the substrate S, except regions C in the shape of a channel, such that a metal thin film is formed in which the particles are continuously connected, as shown in FIG. 2C. Since the metal disposed on one surface of the substrate after the step shown in FIG. 2C is in the form of a film, rather than in the form of a particle, the color development effect by the metal nanoparticles 40 as in the present invention does not occur. Therefore, it can be understood that the metal nanoparticles 40 are formed in FIG. 2A or 2B, which is an initial stage of the thin film.

In order to control the thickness or size of the metal nanoparticles 40, the thin film formation conditions, for example, deposition time, deposition rate, and the like, may be controlled at the early stage of the thin film formation as described above.

For example, when the metal nanoparticles 40 are formed by sputtering, the size and thickness of the metal nanoparticles 40 may be controlled by controlling the time for sputtering from a deposition source made of a metal target. In another example, in the case of the use of arc plasma deposition, the size and thickness of the metal nanoparticles 40 may be controlled by controlling the number of shots which is the number of arcs generated on a metal target. In another example, in the case of the use of CVD or ALD which uses a precursor gas, deposition time, gas flow, substrate temperature, or the like may be controlled. In particular, in the case of ALD in which a plurality of precursor gases are alternately introduced to a substrate, the size and thickness of the metal nanoparticles 40 may be controlled by controlling cycles in which the gases are alternately introduced.

According to embodiments of the present invention, a band of wavelengths to be absorbed, among the light wavelengths incident on the metal coating layer 20, may be controlled by combining and varying the thickness of the light-transmissive dielectric layer 30 disposed on one surface of the metal coating layer 20, the type, thickness, or size of the metal nanoparticles 40 disposed on the light-transmissive dielectric layer 30, and the type of the substrate, and therefore it is possible to impart various colors to the non-metal member.

FIGS. 3A to 3D are diagrams schematically illustrating a structure of a non-metal member having a colored surface according to another embodiment of the present invention.

Figure 3A:
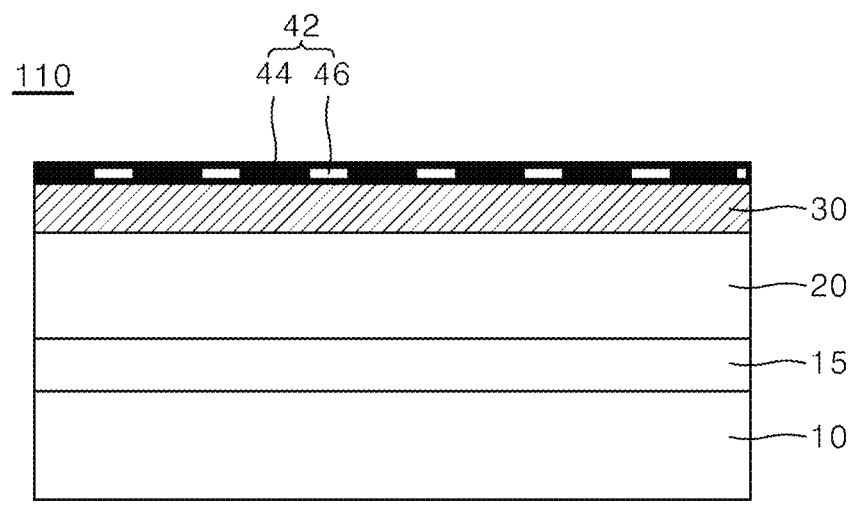
FIGS. 3A to 3D are diagrams schematically illustrating a structure of a non-metal member having a colored surface according to another embodiment of the present invention.
Figure 3B:
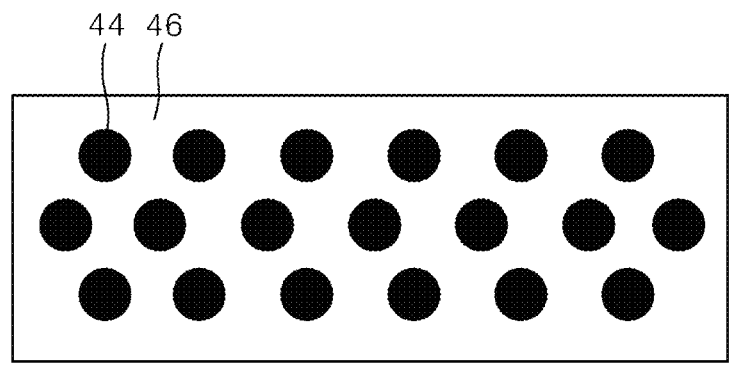

A non-metal member 110 disclosed in FIG. 3A includes a non-metal substrate 10 and a metal coating layer 20 disposed on the non-metal substrate 10, and a bonding layer 15 is interposed between the non-metal substrate 10 and the metal coating layer 20 to improve adhesion. In addition, the non-metal member 110 further includes a light-transmissive dielectric layer 30 disposed on the metal coating layer 20 and a composite material layer 42 disposed on the light-transmissive dielectric layer 30. Hereinafter, a detailed description of the same configuration as described above with reference to FIG. 1 will be omitted. FIG. 3B illustrates a plan view of the composite material layer 42.

The composite material layer 42 in the present embodiment includes a metal 44 and a first material 46 that is not thermodynamically soluble in the metal 44. The metal 44 in the composite material layer 42 is applied only to a part of an upper surface of the light-transmissive dielectric layer 30 to form a pattern, and the first material 46 is applied to the remaining part where the metal 44 is not applied.

The composite material layer 42 may be formed by applying the metal 44 and the first material 46 over one surface of the light-transmissive dielectric layer 30 using a co-deposition method. The co-deposition method means a method that enables a plurality of materials to be simultaneously deposited on a substrate.

In the co-deposition method, for example, the deposition sources of the metal 44 and the first material 46 may be separately prepared, and then the metal 44 and the first material 46 may be deposited from the respective deposition sources over the light-transmissive dielectric layer 30 to form the composite material layer 42. Such a co-deposition method may include a co-evaporation method using separate evaporation sources, a co-sputtering method and a co-plasma arc deposition method which use separate deposition targets, and the like. According to the co-deposition method using separate deposition sources, it is possible to control the composition or area ratio of the metal 44 and the first material 46 in the composite material layer 42 by controlling the amounts of the metal 44 and first material 46 vaporized from each deposition source.

In another example of the co-deposition method, a mixture or alloy of the metal 44 and the first material 46 may be used as a single deposition source, and the metal 44 and the first material 46 may be simultaneously vaporized from the single deposition source to form the composite material layer 42 on the light-transmissive dielectric layer 30. In this case, since the single deposition source is used, the composition or area ratio in the composite material layer 42 may be controlled by controlling the composition of the metal 44 and the first material 46 in the deposition source.

Figure 5:
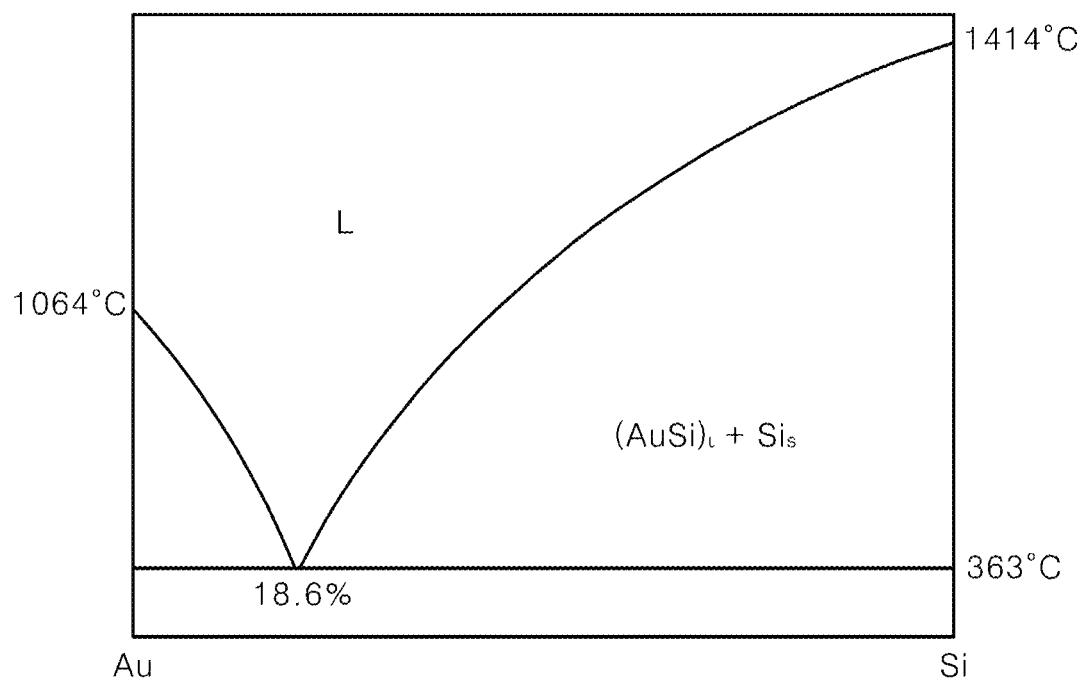
FIG. 5 is an Au—Si binary phase diagram.

The composite material layer 42 is made of the metal 44 and the first material 46 that are not thermodynamically soluble in each other. For example, when the first material 46 constituting the composite material layer 42 contains carbon, the metal 44 may include any one of Ag, Al, Au, Co, Cu, Ni, Pd, Pt, Re, and Zn. When the first material 46 includes any one of Si, Ge, and Si—Ge alloys, the metal 44 may include any one of Ag, Au, Al, and Zn. For example, when the metal 44 is Au and the first material 46 is Si, as shown in the Au—Si binary phase diagram in FIG. 5, Au and Si do not have solubility to each other in the thermodynamic equilibrium state.

When the metals 44 and the first material 46, which do not have solubility to each other, are deposited together on the light-transmissive dielectric layer 30, as shown in FIG. 2C, the microstructure of the formed thin film exhibits a pattern in which the metal 44 and the first material 46 that are applied to different areas on the surface of the substrate are separately present and form a boundary therebetween.

A method of forming the composite material layer 42 may include the above-described methods and be selected according to the types of the metal 44 and the first material 46, and a pattern shape of the composite material layer 42 may be determined according to the type of the metal 44 and the first material 46.

Figure 4A:
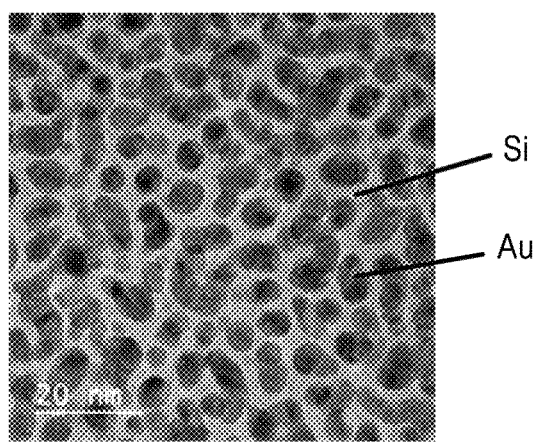
FIGS. 4A and 4B are images obtained by analyzing a surface microstructure of a color pattern structure according to an experimental example of the present invention with a scanning electron microscope (SEM).
Figure 4B:
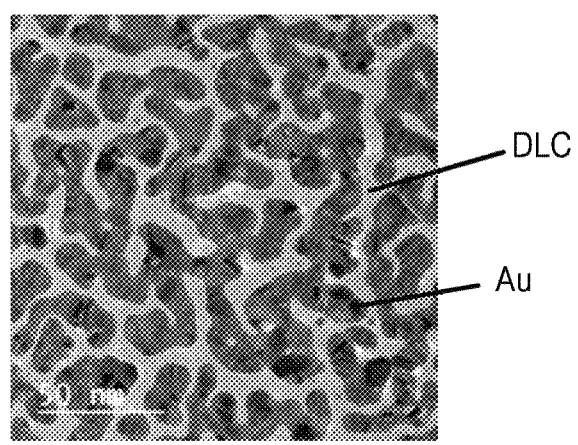

For example, a pattern shape of the composite material layer 42 formed when the metal 44 is Au and the first material 46 is carbon is shown in FIG. 4A and a pattern shape of the composite material layer 42 formed when the metal 44 is Au and the first material 46 is Si is shown in FIG. 4B.

Referring to FIG. 4A, when the composite material layer 42 is an Au—C binary system, a pattern is formed by applying Au to a part of the light-transmissive dielectric layer 30 in the shape of a channel having a plurality of widths which is connected and extended and by applying diamond-like carbon (DLC) to the remaining part of the light-transmissive dielectric layer 30 where Au is not applied.

Referring to FIG. 4B, when the composite material layer 42 is an Au—Si binary system, a pattern is formed by dispersing and applying a plurality of Au nanoparticles spaced apart from each other and by applying Si to space between the Au nanoparticles.

Figure 3C:
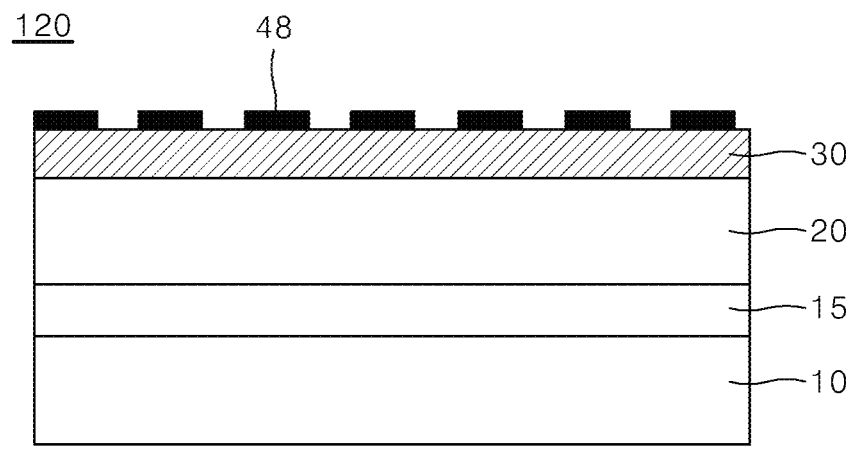

Another example of a color pattern structure is shown in FIG. 3C. Referring to FIG. 3C, a non-metal member 120 includes a non-metal substrate 10 and a metal coating layer 20 disposed on the non-metal substrate 10, and a bonding layer 15 is interposed between the non-metal substrate 10 and the metal coating layer 20 to improve adhesion. In addition, the non-metal member 110 further includes a light-transmissive dielectric layer 30 disposed on the metal coating layer 20 and a metal pattern 48 disposed on the light-transmissive dielectric layer 30. Hereinafter, a detailed description of the same configuration as described above will be omitted.

Figure 3D:
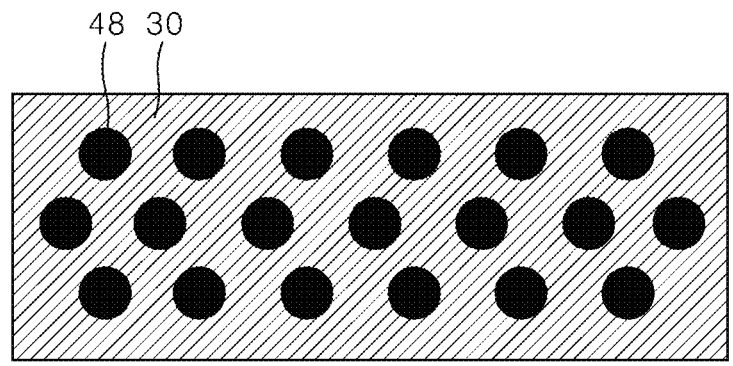

The metal pattern 48 is formed by applying a metal to a part of the light-transmissive dielectric layer 20. The metal pattern 48 may be formed by selectively removing the first material 46 from the composite material layer 42 of the non-metal member 110 shown in FIG. 3A to retain the metal 44 in the shape of the pattern. FIG. 3D illustrates a plan view of the metal pattern 48.

Referring back to FIG. 3A, a method of selectively removing the first material 46 may be selected according to the types of the metal 44 and the first material 46.

For example, in the present invention, when Au is used as the metal 44 and carbon is used as the first material 46, carbon may be burned and removed using a combustion process, and Au may be retained.

In another example, when Au is used as the metal 44 and Si is used as the first material 46, Si is removed using a wet etching method that uses an etching solution, such as HNA, KOH, TMAH, and EDP, and Au may be retained. Alternatively, Si may be removed using a dry etching method that uses an etching gas and Au may be remained.

According to embodiments of the present invention, the metal coating layer 20, it is possible to sequentially form the light-transmissive dielectric layer 30, and the color pattern structure (the metal nanoparticles 40, the composite material layer 20, or the metal pattern 48) on one surface of the non-metal substrate 10 and to control a band of wavelengths to be absorbed, among light wavelengths incident on the metal coating layer 20, by combining and varying the thickness of the light-transmissive dielectric layer 30 and the thickness, size, or shape of the color pattern structure disposed on the light-transmissive dielectric layer 30, thereby imparting various colors to the surface of the non-metal member. It is apparent that the scope of the present invention is not limited by these effects.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A non-metal member having a colored surface, the non-metal member comprising:
a non-metal substrate;
a metal coating layer disposed on the non-metal substrate;
a light-transmissive dielectric layer disposed on the metal coating layer; and
a color pattern structure disposed on the light-transmissive dielectric layer;
wherein the color pattern structure includes a plurality of metal nanoparticles spaced apart from each other, a composite material layer, or a metal pattern including a shape of a channel having a plurality of widths which is connected and extended.

2. The non-metal member of claim 1, wherein the composite material layer includes a metal and a first material that is not thermodynamically soluble in the metal, the metal in the composite material layer is applied to only a part of an upper surface of the light-transmissive dielectric layer to form a pattern, and the first material is applied to a remaining part where the metal is not applied.

3. The non-metal member of claim 2, wherein the metal includes any one of Ag, Al, Au, Co, Cu, Ni, Pd, Pt, and Re.

4. The non-metal member of claim 2, wherein the first material includes any one of carbon, Si, Ge, and Si—Ge alloys.

5. The non-metal member of claim 1, wherein the metal coating layer includes any one of Fe, Al, Cu, Ni, Mg, Zn, Ti, Cr, Ag, Au, Pt, Pd pure metal, and alloys thereof.

6. The non-metal member of claim 1, wherein the light-transmissive dielectric layer includes any one of $TiO_2$, $Al_2O_3$, MgO, $SiO_2$, $Si_3N_4$, and indium tin oxide (ITO).

7. The non-metal member of claim 1, wherein a thickness of the light-transmissive dielectric layer is in a range of 5 nm to 200 nm.

8. The non-metal member of claim 1, wherein a thickness of the metal coating layer is 50 nm or more.

9. The non-metal member of claim 1, wherein an average particle size of the metal nanoparticles is in a range of 2 nm to 50 nm.

10. The non-metal member of claim 1, further comprising a bonding layer interposed between the non-metal substrate and the metal coating layer to improve adhesion.

11. The non-metal member of claim 10, wherein a thickness of the bonding layer is 100 nm or less (greater than 0).

12. The non-metal member of claim 10, wherein the bonding layer includes any one of Ti, Mo, W, Al, Cr, and Ni—Cr.

* * * * *